United States Patent
Nan et al.

(10) Patent No.: US 9,634,616 B2
(45) Date of Patent: Apr. 25, 2017

(54) SINGLE-END AMPLIFIER AND NOISE CANCELLING METHOD THEREOF

(71) Applicant: MStar Semiconductor, Inc., Hsinchu Hsien (TW)

(72) Inventors: Chao-Zhou Nan, Shanghai (CN); Jun-Xiong Deng, Shanghai (CN)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 14/840,369

(22) Filed: Aug. 31, 2015

(65) Prior Publication Data

US 2016/0087592 A1 Mar. 24, 2016

(30) Foreign Application Priority Data

Sep. 24, 2014 (CN) .......................... 2014 1 0495486

(51) Int. Cl.
*H03F 3/16* (2006.01)
*H03F 1/26* (2006.01)
*H03F 1/30* (2006.01)

(52) U.S. Cl.
CPC ............... *H03F 1/26* (2013.01); *H03F 1/301* (2013.01); *H03F 3/16* (2013.01); *H03F 2200/108* (2013.01); *H03F 2200/135* (2013.01); *H03F 2200/18* (2013.01); *H03F 2200/372* (2013.01); *H03F 2200/459* (2013.01); *H03F 2200/492* (2013.01); *H03F 2200/78* (2013.01)

(58) Field of Classification Search
CPC . H03F 3/16; H03F 3/193; H03F 3/345; H03F 2200/294; H03F 2200/489; H03F 2200/492; H03F 2200/498; H03F 2203/45011; H03F 2200/372; H03F 1/30; H03F 2200/18; H03F 1/301; H03G 3/3042

USPC .......................... 330/277, 283, 285, 296, 297
See application file for complete search history.

(56) References Cited

U.S. PATENT DOCUMENTS 7,948,322 B2    5/2011  Lee
2009/0051424 A1*  2/2009  Liu .......................... H03F 1/223
                                                     330/277

FOREIGN PATENT DOCUMENTS

CN        102045033 A      5/2011
CN        102591400 A      7/2012

OTHER PUBLICATIONS

TIPO Office Action, Jun. 27, 2016, 4 pages.
SIPO Office Action, Oct. 26, 2016, 8 pages.

* cited by examiner

*Primary Examiner* — Khanh V Nguyen
(74) *Attorney, Agent, or Firm* — Edell, Shapiro & Finnan, LLC

(57) ABSTRACT

A single-end amplifier includes: a noise cancelling circuit, coupled to a power supply, configured to receive a power signal and to cancel a part of ripples and noises in the power signal to generate an initial signal; an amplifying circuit, configure to receive the initial signal at a first end of the amplifying signal, and to amplify the initial signal to generate a first signal at a second end; and a first transmitting circuit, configured to receive the power signal and to generate a second signal at the second end of the amplifying circuit. The first signal and the second signal are superimposed and outputted to cancel most part of the ripples and noises in the power signal. The noise cancelling circuit includes a first capacitor and a first choke coil.

10 Claims, 3 Drawing Sheets

SINGLE-END AMPLIFIER AND NOISE CANCELLING METHOD THEREOF

This application claims the benefit of People's Republic of China application Serial No. 201410495486.0, filed Sep. 24, 2014, the subject matter of which is incorporated herein by reference.

BACKGROUND OF THE INVENTION

Field of the Invention

The invention relates in general to integrated circuits, and more particularly to a single-end amplifier and a noise cancelling method thereof.

Description of the Related Art

In an integrated circuit, ripples and noises in an input power affect circuit performance. Thus, in circuits sensitive to ripples and noises, the cancellation of ripples and noises is first carried out, and a newly generated input power is then provided to a circuit to ensure the performance of the circuit.

In an actual circuit, especially in a single-end amplifying circuit, a power management integrated chip (PMIC) and a low dropout (LDO) linear regulator is frequently employed to reduce ripples and noises. However, due to the resonance between a welding capacitor and an on-chip capacitor, certain ripples and noise peaks inevitably exist in the bandwidth such that the performance of the circuit may be significantly degraded. In current technologies, a negative feedback loop or a filter capacitor is usually added to further suppress the ripples and noises. Such design may be needed for specific circuits, leading to not only circuit complications but also increased additional power consumption.

SUMMARY OF THE INVENTION

The invention is directed to a single-end amplifier and a noise cancelling method capable of reducing ripples and noises. The single-end amplifier and the noise cancelling method of the present invention have a simple circuit structure, and are applicable to various different circuits without increasing power consumption.

A single-end amplifier is provided according to an embodiment of the present invention. The single-end amplifier includes: a noise cancelling circuit, coupled to a power supply, configured to receive a power signal to generate an initial signal; an amplifying circuit, having a first end and a second end that is coupled to the noise cancelling circuit, configured to receive the initial signal, and to amplify the initial signal to generate a first signal at the second end; and a first transmitting circuit, coupled between the power supply and the second end of the amplifying circuit, configured to receive the power signal and to generate a second signal at the second end of the amplifying circuit. The noise cancelling circuit includes a first capacitor and a first choke coil. The first capacitor has one end coupled to the power signal, and the other end coupled to the first end of the amplifying circuit and grounded via the first choke coil. The first signal and the second signal are superimposed at the second end of the amplifying circuit and outputted from the second end of the amplifying circuit to cancel ripples and noises in the power signal.

A noise cancelling method for a single-end amplifier is further provided according to another embodiment of the present invention. The noise cancelling method includes: receiving a power signal by a noise cancelling circuit and generating an initial signal; receiving the initial circuit at a first end of an amplifying circuit, and amplifying the initial signal to generate a first signal at a second end of the amplifying circuit; receiving the power signal and transmitting the power signal to the second end of the amplifying signal to generate a second signal; superimposing the first signal and the second signal at the second end of the amplifying circuit, and outputting the superimposed first and second signals to cancel ripples and noises in the power signal. The noise cancelling circuit includes a first capacitor and a first choke coil. The first capacitor has one end coupled to the power signal, and the other end coupled to the first end of the amplifying circuit and grounded via the first choke coil. The second end of the amplifying circuit is coupled to the power signal, and is an output end of the single-end amplifier.

With the above solution, the present invention provides following features. By cancelling a part of ripples and noises in the power signal through the noise cancelling circuit, the superimposed and processed first and second signals outputted from the second end of the amplifying circuit are capable of significantly reducing the ripples and the noises in the power signal. Further, the present invention has a simple circuit structure that does not increase additional power consumption, and can be applied to various different circuits.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
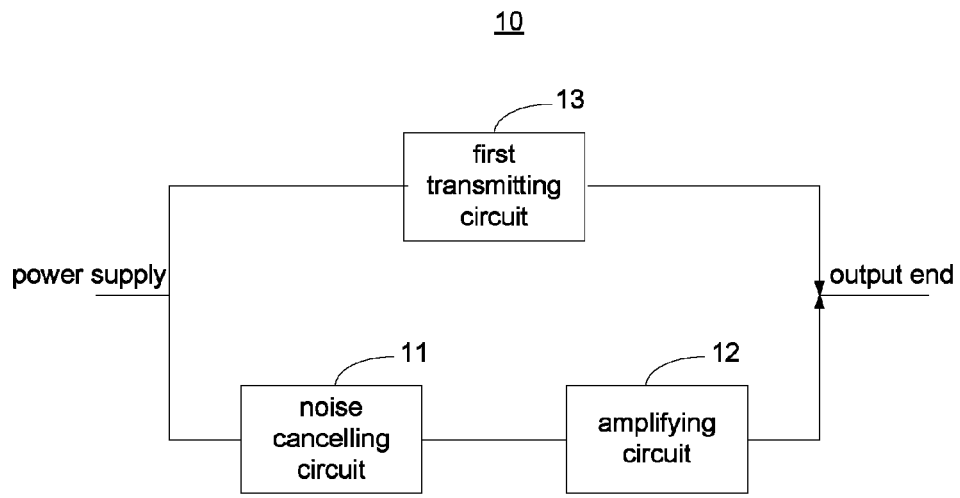
FIG. 1 is a schematic diagram of a single-end amplifier according to a first embodiment of the present invention.

FIG. 1 shows a schematic diagram of a single-end amplifier according to a first embodiment of the present invention. Referring to FIG. 1, a single-end amplifier 10 includes a noise cancelling circuit 11, an amplifying circuit 12 and a first transmitting circuit 13. The noise cancelling circuit 11, coupled to a power supply, receives a power signal and cancels a part of ripples and noises in the power signal to generate an initial signal. The amplifying circuit 12 has a first end and a second end, with the first end coupled to the noise cancelling circuit 11. Thus, the amplifying circuit 12 receives the initial signal and amplifies the initial signal to generate a first signal at the second end. The first transmitting circuit 13, coupled between the power supply and the second end of the amplifying circuit 12, receives the power signal and generates a second signal at the second end of the amplifying circuit 12. The first signal and the second signal are superimposed at the second end of the amplifying circuit 12 and then outputted from the second end of the amplifying circuit 12 to cancel a part of the ripples and noises in the power signal VCC.

Figure 2:
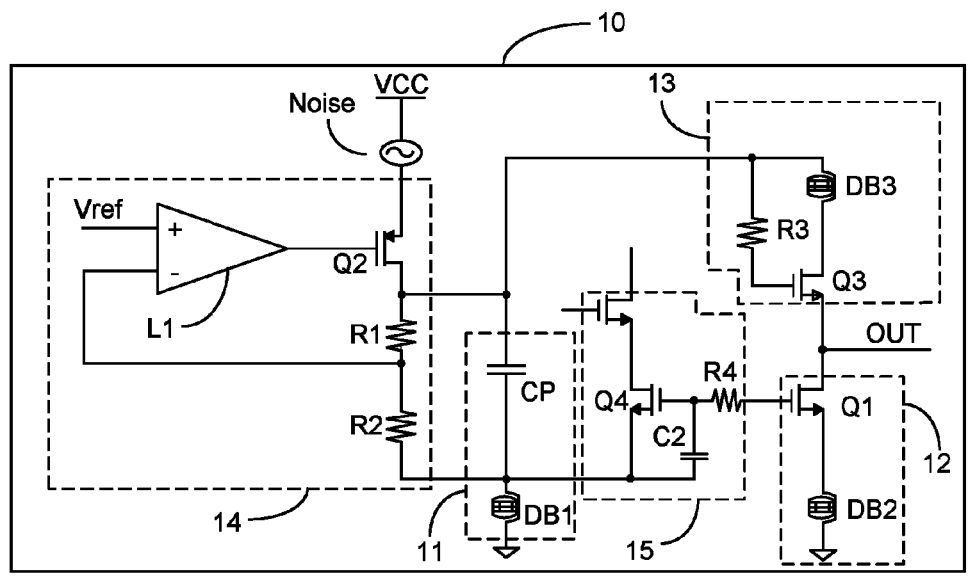
FIG. 2 is a circuit diagram of a single-end amplifier according to the first embodiment of the present invention.

FIG. 2 shows a circuit diagram of a single-end amplifier according to the first embodiment of the present invention. As shown in FIG. 2, the single-end amplifier 10 further includes an LDO circuit 14 and a second transmitting circuit 15. The power signal VCC includes ripples and noises, and is divided into two signals after being outputted from the LDO circuit 14. One of the two signals is transmitted through the noise cancelling circuit 11 and the second transmitting circuit 15 to the first end of the amplifying circuit 12, and is then amplified by the amplifying circuit 12 and forwarded to the second end of the amplifying circuit 12 to generate the first signal. The other of the two signals is transmitted through the first transmitting circuit 13 to the second end of the amplifying circuit 12 to generate the second signal. The first signal and the second signal are superimposed at the second end of the amplifying circuit 12 and outputted from the second end of the amplifying circuit 12 to cancel most part of the ripples and noises in the power signal VCC.

In one embodiment of the present invention, the noise cancelling circuit 11 includes a first capacitor CP and a first choke coil DB1. The capacitor CP has one end coupled to the power signal VCC via the LDO circuit 14, and the other end coupled to the first end of the amplifying circuit 12 and grounded via the first choke coil DB1. The second end of the amplifying circuit 12 is coupled to the power signal VCC via the first transmitting circuit 13 and the LDO circuit 14, and is an output end of the single-end amplifier 10. The ripples and noises in the power signal VCC can be reduced by grounding the capacitor CP via the first choke coil DB1. The amplifying circuit 12 includes a first transistor Q1 and a second choke coil DB2. The first transistor Q1 has its first end coupled to the first capacitor CP, its second end coupled to the power signal VCC, and its third end grounded via the second choke coil DB2. The second end of the first transistor Q1 is an output end. Preferably, the first transistor Q1 is a PMOS transistor, and has its first end as a gate, a second end as a drain and a third end as a source. Out of the two signals divided from the power signal VCC by the LDO circuit 14, one is transmitted through the first capacitor CP and the second transmitting circuit 15 to the gate of the first transistor Q1, and is amplified by the first transistor Q1 and forwarded to the drain of the first transistor Q1 to generate the first signal. The other signal is transmitted through the first transmitting circuit 13 to the drain of the first transistor Q1 to generate the second signal. The first signal and the second signal are superimposed at the drain of the transistor Q1 and outputted from the second end of the amplifying circuit 12 to cancel most part of the ripples and noises in the power signal VCC.

In the embodiment, the LDO circuit 14 includes a second transistor Q2, a comparator L1, a first resistor R1 and a second resistor R2. The second transistor Q2 has its first end coupled to an output end of the comparator L2, its second end coupled to one end of the first capacitor CP and one end of the first resistor R1, and its third end coupled to the power signal VCC. The first resistor R1 has its other end coupled to a negative input end of the comparator L1 and one end of the second resistor R2, which has its other end coupled to the other end of the first capacitor CP. The comparator L1 has its positive input end coupled to a first reference voltage Vref. Preferably, the second transistor Q2 is an NMOS transistor, and has its first end as a gate of the NMOS transistor, its second end as a drain of the NMOS transistor, and its third end as a source of the NMOS transistor.

In the embodiment, the first transmitting circuit 13 includes a third transistor Q3, a third resistor R3 and a third choke coil DB3. The first capacitor CP has one end coupled to a first end of the third transistor Q3 via the third resistor R3, and further coupled to a second end of the third transistor Q3 via the third choke coil DB3. The third transistor Q3 has its third end coupled to the second end of the first transistor Q1. Preferably, the third transistor Q3 is a PMOS transistor, and has its first end as a gate of the PMOS transistor, its second end as a drain of the PMOS transistor and its third end as a source of the PMOS transistor.

In the embodiment, the second transmitting circuit 15 includes a fourth transistor Q4, a fourth resistor R4 and a second capacitor C2. The fourth transistor Q4 has its first end coupled to the other end of the first capacitor CP via the second capacitor C2 and further coupled to the first end of the first transistor Q1 via the fourth resistor R4. The fourth resistor R4 has its third end coupled to the other end of the first capacitor CP. Preferably, the fourth transistor Q4 is a PMOS transistor, and has its first end as a gate of the PMOS transistor, its second end as a drain of the PMOS transistor and its third end as a source of the PMOS transistor.

In the embodiment, the configuration of the first capacitor CP, the first choke coil DB1 and the second choke coil DB2 is capable of reducing the ripples and noises in the power signal without increasing power consumption, and is applicable to various different circuits.

Figure 3:
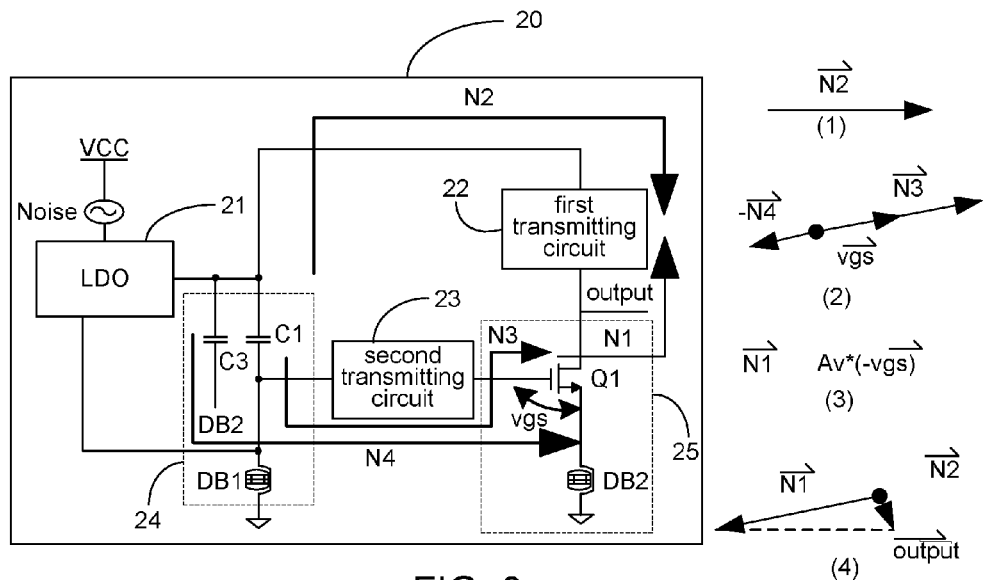
FIG. 3 is a circuit diagram of a single-end amplifier according to a second embodiment of the present invention.

FIG. 3 shows a circuit diagram of a single-end amplifier according to a second embodiment of the present invention. Referring to FIG. 3, a single-end amplifier 20 includes an LDO circuit 21, a first transmitting circuit 22, a second transmitting circuit 23, a noise cancelling circuit 24 and an amplifying circuit 25. The noise cancelling circuit 24 includes a first capacitor C1, a third capacitor C3 and a first choke coil DB1. The power signal VCC is divided into two signals after being outputted from the LDO circuit 21. From the two signals, one is transmitted through the noise cancelling circuit 24 and the second transmitting circuit 23 to a first end of the amplifying circuit 25, and is amplified by the amplifying circuit 25 and forwarded to a second end of the amplifying circuit 25 to generate a first signal. The other signal is transmitted through the first transmitting circuit 22 to the second end of the amplifying circuit 25 to generate a second signal. The first signal and the second signal are superimposed at the second end of the amplifying circuit 25 and outputted from the second end of the amplifying circuit 25 to cancel most part of the ripples and noises in the power signal VCC.

In one embodiment of the present invention, the noise cancelling circuit 24 includes a first capacitor C1, a third capacitor C3 and a first choke coil DB1. The first capacitor C1 has one end coupled to the power signal VCC via the LDO circuit 21, and the other end coupled to the first end of the amplifying circuit 25 and grounded via the first choke coil DB1. The second end of the amplifying circuit 25 is coupled to the power signal VCC via the first transmitting circuit 22 and the LDO circuit 21, and is an output end. The first capacitor C1 is grounded via the first choke coil DB1, and is capable of reducing the ripples and noises in the power signal VCC. The amplifying circuit 25 includes a first transistor Q1 and a second choke coil DB2. The first transistor Q1 has its gate coupled to the first capacitor C1, its drain coupled to the power signal VCC, and is source grounded via the second choke coil DB2. The drain of the first transistor Q1 is an output end. The first transistor is a PMOS transistor.

Figure 4:
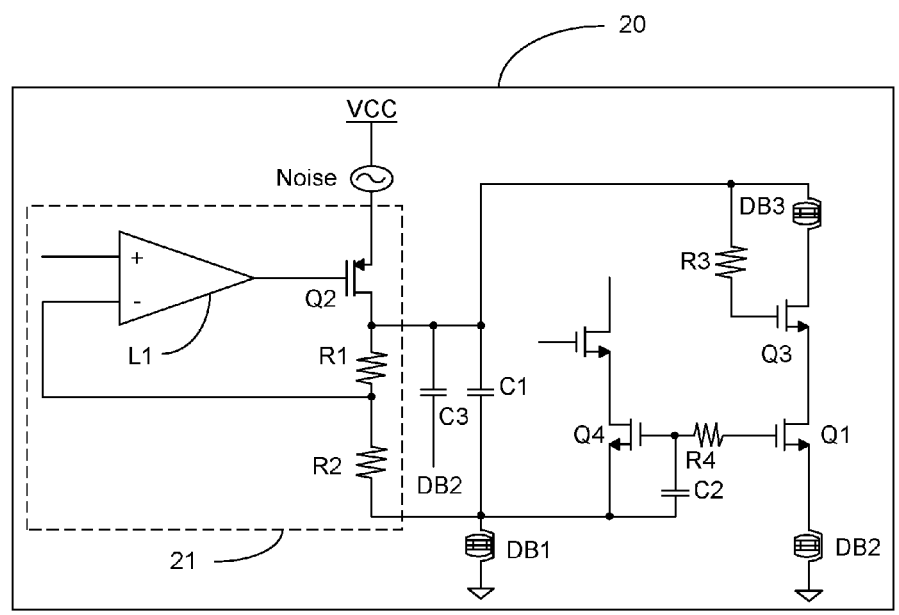
FIG. 4 is a circuit diagram of a single-end amplifier according to the second embodiment of the present invention.

FIG. 4 shows a circuit diagram of a single-end amplifier according to the second embodiment of the present invention. In the embodiment, as shown in FIG. 4, internal circuits of the LDO circuit 21, the first transmitting circuit 22 and the second transmitting circuit 23 are identical to those in FIG. 2. One difference of the single-end amplifier 20 in FIG. 2 from the single-end amplifier 10 is that, the noise cancelling circuit 11 of the single-end amplifier 10 includes the first capacitor CP, and the noise cancelling circuit 24 of the single-end amplifier 20 includes the first capacitor C1 and the third capacitor C3. The connection details of the first capacitor C1 is identical to that of the first capacitor CP, i.e., coupled to the gate of the first transistor Q1 via the second transmitting circuit 23 and grounded via the first choke coil DB1. In the diagrams, for better understanding and illustration, these capacitors are marked as the first capacitor for that they have similar connection details in the single-end amplifiers and have similar functions. The third capacitor C3 has one end coupled to a drain of the second transistor Q1, and the other end coupled between the source of the first transistor Q1 and the second choke coil DB2.

In the embodiment, as shown in FIG. 3, the power signal VCC passes through the first transmitting circuit 22 to generate a second signal N2 at the drain of the first transistor Q1. The power signal VCC passes through the first capacitor to generate a third signal at the first end of the first transistor, and passes through the third capacitor to generate a fourth signal at the third end of the first transistor. The third signal and the fourth signal are superimposed to output a first signal from the second end of the transistor. More specifically, the power signal VCC passes through the first capacitor C1 and the second transmitting circuit 23 to generate a third signal N3 at the gate of the first transistor Q1, and passes through the third capacitor C3 to generate a fourth signal N4 at the source of the first transistor Q1. When the power signal passes through the first capacitor C1 and the second transmitting circuit 23, the signal part is amplified, whereas the noise part is kept at an original size instead of also being amplified. Therefore, the noise parts of the third signal N3 and the fourth signal N4 have opposite phases and substantially equal strength levels.

The third signal N3 and the fourth signal N4 are superimposed to obtain a voltage difference vgs between the gate and the source of the first transistor Q1:

$$\overrightarrow{vgs} = \overrightarrow{N3} - (-\overrightarrow{N4})$$

The voltage difference vgs is amplified by Av times by the first transistor Q1 to output the first signal N1:

$$\overrightarrow{N1} = Av^*(-\overrightarrow{vgs})$$

The first signal N1 and the second signal N2 are superimposed to generate an output signal output:

$$\overrightarrow{output} = \overrightarrow{N1} + \overrightarrow{N2}$$

In the embodiment, as the noise parts in the third signal N3 and the fourth signal N4 have opposite phases and substantially the same signal strength levels, the third signal N3 and the fourth signal N4 after having been superimposed are capable of significantly reducing the ripples and noises in the power signal, i.e., significantly increasing a power supply rejection ratio (PSRR) of the single-end amplifier.

Figure 5:
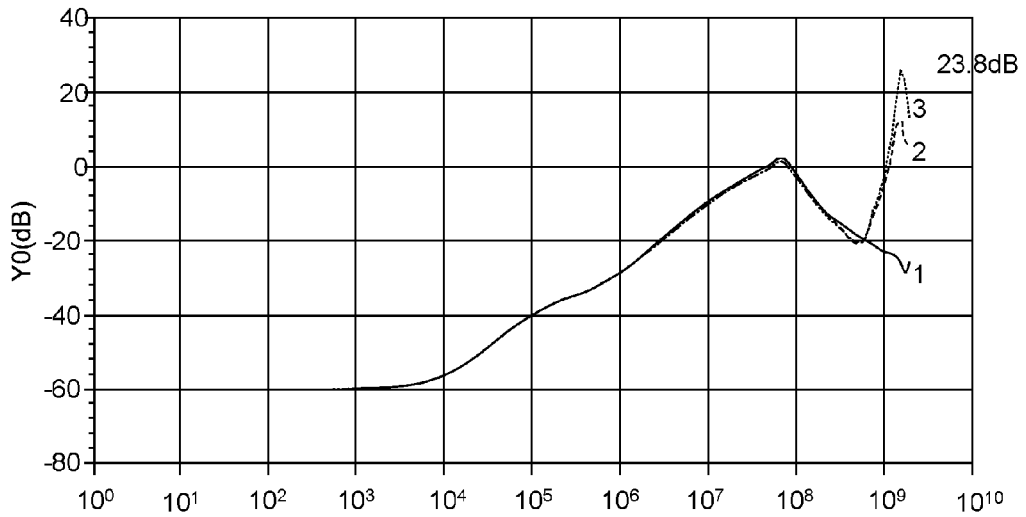
FIG. 5 is a schematic diagram of simulation results of PSRR of single-end amplifiers of the embodiments and a conventional single-end amplifier.

FIG. 5 shows a schematic diagram of simulation results of PSRR of the single-end amplifiers of the embodiments of the present invention and conventional single-end amplifiers. In FIG. 5, the horizontal axis represent frequency values and the vertical axis represents PSRR values. As shown in FIG. 5, a solid line 1 represents a conventional single-end amplifier, i.e., PSRR values of a circuit without the first choke coil DB1 and the second choke coil DB2, a long dotted line 2 represents the PSRR values of the circuit in FIG. 2, and a short dotted line 3 represents the PSRR values of the circuits in FIG. 3 and FIG. 4. It is seen that, the PSRR values of the circuits in FIG. 3 and FIG. 4 are optimal, which is 23.8 dB, meaning that the ripples and noises in the power signal VCC are reduced by a largest extent.

In the embodiment, the single-end amplifier 20 is capable of significantly reducing the ripples and noises without adding a complicated negative feedback loop. Such design has a simple circuit structure without increasing power consumption, and is applicable to different circuits.

Figure 6:
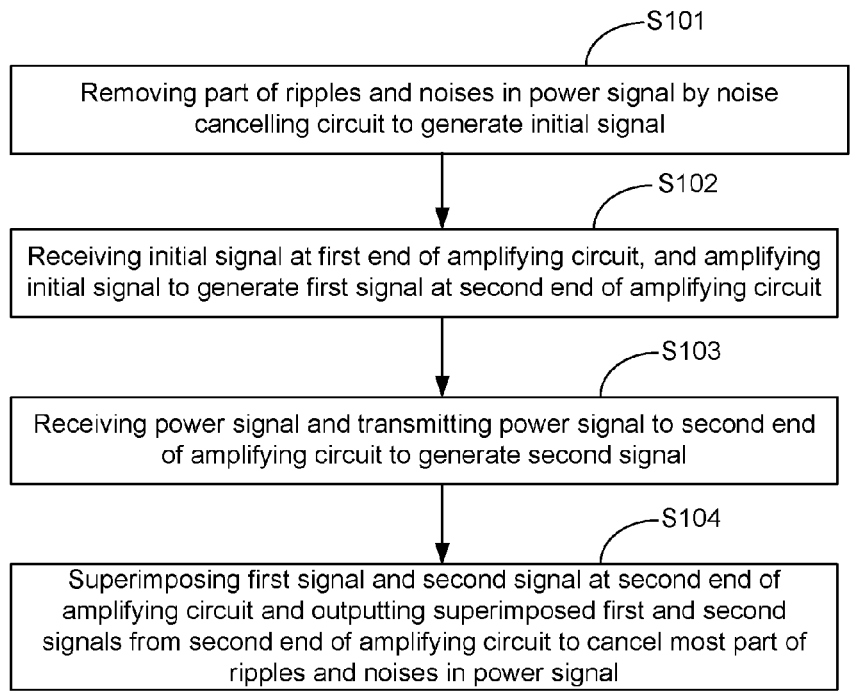
FIG. 6 is a flowchart of a noise cancelling method for a single-end amplifier according to a third embodiment of the present invention.

FIG. 6 shows a flowchart of a noise cancelling method for a single-end amplifier according to a third embodiment of the present invention. The single-end amplifier includes a noise cancelling circuit and an amplifying circuit. The noise cancelling circuit includes a first capacitor and a first choke coil. The first capacitor has one end coupled to a power signal, and the other end coupled to a first end of the amplifying circuit and grounded via the first choke coil. A second end of the amplifying circuit is coupled to the power signal, and is an output end of the single-end amplifier. As shown in FIG. 6, the noise cancelling method for a single-end amplifier includes following steps.

In step S101, a part of ripples and noises in the power signal are cancelled by the noise cancelling circuit to generate an initial signal.

In step S101, the power signal passes through a low dropout (LDO) linear regulator circuit and is outputted. The first capacitor in the noise cancelling circuit is grounded via the first choke coil DB1 to reduce the ripples and noises in the power signal VCC.

In step S102, the initial signal is received at the first end of the amplifying circuit, and the initial signal is amplified to generate a first signal at the second end of the amplifying circuit.

In step S103, the power signal is received and transmitted to the second end of the amplifying circuit to generate a second signal.

In step S104, the first signal and the second signal are superimposed at the second end of the amplifying circuit and outputted from the second end of the amplifying circuit to cancel most part of the ripples and noises in the power signal.

In another embodiment of the present invention, the amplifying circuit includes a first transistor. The power signal passes through the first capacitor to generate a third signal at a first end of the first transistor, and passes through a third capacitor to generate a fourth signal at a third end of the first transistor. The third signal and the fourth signal are superimposed and amplified to output the first signal at a second end of the first transistor. More specifically, the single-end amplifier further includes a first transmitting circuit and a second transmitting circuit. The power signal passes through the first capacitor and the second transmitting circuit to generate the third signal at the gate of the first transistor, and passes through the third capacitor to generate the fourth signal at the source of the first transistor. When the power signal passes through the first capacitor and the second transmitting circuit, the signal part is amplified whereas the noise part is kept at an original size instead of also being amplified. The noise parts in the third signal and the fourth signal have opposite phases and substantially equal signal strength levels. As the noise parts in the third signal and the fourth signal have opposite phases and substantially equal signal strength levels, after superimposing the third signal and the fourth signal, the ripples and noises in the power signal can be significantly reduced. A voltage difference between the gate and the source of the first transistor is obtained after superimposing the third signal and the fourth signal. The voltage difference is amplified through the first transistor to output the first signal. In the first signal generated, the signal part in the power signal is amplified whereas the noise part is kept unchanged.

In the embodiment, the ripples and noises in the power signal are significantly reduced without adding a complicated negative feedback loop. Further, the circuit structure is kept simple without increasing power consumption, and can be applied to various different circuits.

In conclusion, in the present invention, a power signal is received by a noise cancelling circuit to cancel a part of ripples and noises in the power signal and to generate an initial signal. The initial signal is received at a first end of an amplifying circuit and amplified to generate a first signal at a second end of the amplifying circuit. The first transmitting circuit receives the power signal and generates a second signal at the second end of the amplifying circuit. The second end of the amplifying circuit is an output end of the single-end amplifier. The first signal and the second signal are superimposed at the output end and outputted at the second end of the amplifying circuit to remove most part of the ripples and noises in the power signal. The noise cancelling circuit includes the first capacitor and a first choke coil. The first capacitor has one end coupled to the power signal, and the other end coupled to the first end of the amplifying circuit and grounded via the first choke coil. Thus, the present invention significantly reduces the ripples and noises in the power signal, has a simple circuit structure without increasing power consumption, and can be applied to various different circuits.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A single-end amplifier, comprising:
a noise cancelling circuit, coupled to a power supply, configured to receive a power signal and to generate an initial signal;
an amplifying circuit, having a first end and a second end, the first end coupled to the noise cancelling circuit, the amplifying circuit configured to receive the initial signal and to amplify the initial signal to generate a first signal at the second end; and
a first transmitting circuit, coupled between the power supply and the second end of the amplifying circuit, configured to receive the power signal and to generate a second signal at the second end of the amplifying circuit;
wherein the noise cancelling circuit comprises a first capacitor and a first choke coil; the first capacitor has a first end coupled to the power signal, and a second end coupled to the first end of the amplifying circuit and grounded via the first choke coil; the first signal and the second signal are superimposed at the second end of the amplifying circuit and outputted to cancel ripples and noises in the power signal.

2. The single-end amplifier according to claim 1, wherein the amplifying circuit comprises a first transistor and a second choke coil; the first transistor has a first end coupled to the first capacitor, a second end coupled to the power signal, and a third end grounded via the second choke coil; the second end of the first transistor is coupled to the second end of the amplifying circuit.

3. The single-end amplifier according to claim 2, further comprising:
a low dropout (LDO) linear regulator circuit, through which the power signal is regulated and outputted, the LDO linear regulator circuit comprising a second transistor, a comparator, a first resistor and a second resistor;
wherein the second transistor has a first end coupled to an output end of the comparator, a second end coupled to the first end of the first capacitor and a first end of the first resistor, and a third end coupled to the power signal; the first resistor has a second end coupled to a negative input end of the comparator and a first end of the second resistor; the second resistor has a second end coupled to the second end of the first capacitor; the comparator has a positive input end coupled to a first reference voltage.

4. The single-end amplifier according to claim 3, wherein the first transmitting circuit comprises a third transistor, a third resistor and a third choke coil; the first end of the first capacitor is coupled to a first end of the third transistor via the third resistor, and further coupled to a second end of the third transistor via the third choke coil; the third transistor has a third end coupled to the second end of the first transistor.

5. The single-end amplifier according to claim 4, further comprising:
a second transmitting circuit;
wherein the power signal passes through the first capacitor and the second transmitting circuit to generate a third signal at the first end of the first transistor; the second transmitting circuit comprises a fourth transistor, a fourth resistor and a second capacitor; the fourth transistor has a first end coupled to the second end of the first capacitor via the second capacitor, and coupled to the first end of the first transistor via the fourth resistor; the fourth transistor has a third end coupled to the second end of the first capacitor.

6. The single-end amplifier according to claim 5, wherein the noise cancelling circuit further comprises a third capacitor; the third capacitor has a first end coupled to the power signal, and a second end coupled between the first transistor and the second choke coil to generate a fourth signal at the third end of the first transistor; the third signal and the fourth signal are superimposed to obtain a voltage difference between the first end and the third end of the first transistor; the voltage difference is amplified through the first transistor to output the first signal at the second end; the first signal and the second signal are superimposed to generate the output signal.

7. The single-end amplifier according to claim 6, wherein the third signal and the fourth signal comprise noise parts having opposite phases and substantially equal signal strength levels.

8. The single-end amplifier according to claim 7, wherein the first transistor, the third transistor and the fourth transistor are NMOS transistors; the second transistor is a PMOS transistor.

9. A noise cancelling method for a single-end amplifier, the single-end amplifier comprising a noise cancelling circuit and an amplifying circuit, the method comprising:
- receiving a power signal by a noise cancelling circuit and generating an initial signal;
- receiving the initial signal at a first end of the amplifying circuit, and amplifying the initial signal to generate a first signal at a second end of the amplifying circuit;
- receiving the power signal and transmitting the power signal to generate a second signal at the second end of the amplifying circuit; and
- superimposing the first signal and the second signal to output the superimposed first and second signals to cancel ripples and noises in the power signal;
- wherein the noise cancelling circuit comprises a first capacitor and a first choke coil; the first capacitor has a first end coupled to the power signal, and a second end coupled to the first end of the amplifying circuit and grounded via the first choke coil; the second end of the amplifying circuit is an output end of the single-end amplifier.

10. The method according to claim 9, wherein the amplifying circuit comprises a first transistor, the noise cancelling circuit further comprises another capacitor, and the step of generating the first signal comprises:
- generating a third signal at a first end of the first transistor through the first capacitor;
- generating a fourth signal at a third end of the first transistor through the another capacitor; and
- superimposing and amplifying the third signal and the fourth signal to output the first signal at a second end of the first transistor;
- wherein the third signal and the fourth signal comprise noise parts having opposite phases and substantially equal signal strength levels.

* * * * *